(12) United States Patent
Akamatsu et al.

(10) Patent No.: US 6,297,675 B1
(45) Date of Patent: Oct. 2, 2001

(54) SEMICONDUCTOR INTEGRATED CIRCUIT AND SEMICONDUCTOR INTEGRATED CIRCUIT SYSTEM HAVING SERIALLY INTERCONNECTABLE DATA BUSES

(75) Inventors: Hironori Akamatsu; Yutaka Terada; Takashi Hirata; Yukio Arima; Satoshi Takahashi; Tadahiro Yoshida; Yoshihide Komatsu; Hiroyuki Yamauchi, all of Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/478,530

(22) Filed: Jan. 6, 2000

(30) Foreign Application Priority Data

Jan. 7, 1999 (JP) ................................. 11-002136

(51) Int. Cl.[7] .................................................. H03B 1/00
(52) U.S. Cl. ......................... 327/108; 307/52; 375/220
(58) Field of Search ................................ 327/108, 318, 327/319, 333, 403, 404; 326/62; 307/52, 53, 55, 60, 61; 375/220

(56) References Cited

U.S. PATENT DOCUMENTS

| | | | |
|---|---|---|---|
| 4,493,092 | * | 1/1985 | Adams ................................. 375/36 |
| 4,495,626 | * | 1/1985 | Brunin et al. ........................ 375/17 |
| 4,947,406 | * | 8/1990 | Yokoyama .......................... 375/36 |
| 5,063,540 | * | 11/1991 | Takahashi .......................... 365/175 |
| 5,193,200 | * | 3/1993 | Asprey et al. ...................... 345/168 |
| 5,220,211 | * | 6/1993 | Christopher et al. ............... 326/90 |
| 5,264,744 | * | 11/1993 | Mizukami et al. ................. 326/62 |
| 5,282,173 | * | 1/1994 | Miyaji et al. ...................... 365/230.3 |
| 5,331,206 | * | 7/1994 | Liron ................................. 327/108 |
| 5,373,469 | * | 12/1994 | Akioka et al. ..................... 365/189.5 |
| 5,680,366 | * | 10/1997 | Kotani et al. ...................... 365/230.6 |
| 5,742,551 | * | 4/1998 | Yakutake et al. .................. 365/207 |
| 5,831,453 | * | 11/1998 | Stamoulis et al. ................. 326/113 |
| 5,926,509 | * | 7/1999 | Stewart et al. .................... 375/257 |

OTHER PUBLICATIONS

Prepared by the High Performance Serial Bus Working Group of the Microprocessor and Microcomputer Standards Committee, "P1394 Standard for a High Performance Serial Bus", IEEE Standards Draft 8.0v4, pp 1–2, Nov. 21, 1995.

* cited by examiner

Primary Examiner—Timothy P. Callahan
Assistant Examiner—Hai L. Nguyen
(74) Attorney, Agent, or Firm—McDermott, Will & Emery (57) ABSTRACT

A data line pair and a strobe line pair are provided between first and second chips to exchange data therebetween. The first chip includes an output circuit and a controller for controlling the output circuit. The second chip includes an input circuit. For example, the output circuit supplies a direct current from a power supply to one of the data lines. Then, the input circuit feeds back the received current to the output circuit through a pair of terminal resistors and the other data line. Subsequently, the output circuit supplies the fed back direct current to one of the strobe lines. In response, the input circuit feeds back the received current again to the output circuit through another pair of terminal resistors and the other strobe line. And then the fed back current is drained to the ground. Thus, compared to driving the data and strobe line pairs separately with the same amount of current supplied, the current dissipation can be halved. In this manner, the present invention is applicable to reduction of current dissipation when data should be transmitted at high speeds through multiple data bus pairs that are driven with a current supplied.

19 Claims, 7 Drawing Sheets

SEMICONDUCTOR INTEGRATED CIRCUIT AND SEMICONDUCTOR INTEGRATED CIRCUIT SYSTEM HAVING SERIALLY INTERCONNECTABLE DATA BUSES

BACKGROUND OF THE INVENTION

The present invention relates to an improved semiconductor integrated circuit that can transmit data at high speeds with reduced power dissipation and also relates to a system including such a circuit.

Present-day semiconductor integrated circuits (like an IEEE 1394 physical layer LSI) are specially designed to transmit data from unit to unit at high speeds to implement a system that can process a tremendously large quantity of data as fast as possible to cope with multimedia applications, in particular. As a result of recent vigorous research and development, the state-of-the-art semiconductor integrated circuits can normally transmit data at as high a rate as 200 megabits per second (Mbps). Some integrated circuits have already doubled the transmission rate although those circuits are just samples up to now. Furthermore, an extremely-high-speed data transmission technique exceeding 1 gigabits per second (Gbps) has also been realized albeit experimentally.

In the IEEE 1394 physical LSI, data is sent as direct current from the transmitting end through a differential twisted pair of cables. A resistor is connected between the twisted pair, and a potential difference between the twisted pair, which is variable with the current flowing through the resistor, will be supplied to the receiving end. The IEEE 1394 physical layer LSI also adopts a data transmission technique termed "DS-Link". Specifically, in transmitting data, a pair of data lines and a pair of strobe lines are associated with each single port. The specifications of the IEEE 1394 standards are described in Draft Standard Vex. 8.4.

According to the IEEE 1394 physical layer LSI technology, however, a considerable amount of current is always consumed at the output ports because the direct current is output through the twisted pair. Particularly when an integrated circuit is provided with an increased number of output ports, the increase in current dissipation poses a serious problem. Moreover, although data is supposed to change its level on either the data line or strobe line pair in accordance with the DS-Link technique, the direct current is always flowing through the pair with no data transitions, thus also increasing the amount of currents consumed.

SUMMARY OF THE INVENTION

An object of the present invention is providing (1) a semiconductor integrated circuit optimized to reduce the amount of current dissipated in transmitting data at high speeds as in the IEEE 1394 physical layer LSI, and (2) a system including such a circuit.

To achieve this object, when data is transmitted through multiple data bus pairs like the pairs of data and strobe lines, one of the data bus pairs is selectively driven with a current supplied. And then the current that has flowed through the selected pair is used again according to the present invention to drive the other data bus pair.

A semiconductor integrated circuit system according to the present invention includes first and second chips and a plurality of complementary data buses. Each of the buses is terminated with a resistor. The system exchanges data between the first and second chips through the complementary data buses. The inventive system further includes: a driver with a current drive capability, which drives the complementary data buses with a current supplied thereto; and means for selecting a changeable current path between power supply and ground through the complementary data buses.

In one embodiment of the present invention, each said complementary data bus consists of a pair of data lines. One of the data lines makes the current flow from the first to the second chip, while the other data line makes the current flow from the second to the first chip.

In another embodiment of the present invention, the system further includes an input circuit for receiving potential differences at the respective terminal resistors of the complementary data buses. The input circuit covers a wide range including all center potentials of the potential differences at the respective terminal resistors of the complementary data buses.

In still another embodiment, center potentials of potential differences at the respective terminal resistors of the complementary data buses are biased toward a supply or ground potential as a whole.

A semiconductor integrated circuit according to the present invention is connected to multiple data bus pairs, each of which is terminated with a resistor. The circuit includes means for selecting a changeable current path between first and second power supplies through the data bus pairs. The changeable path selecting means includes: a first current source connected to the first power supply; a second current source connected to the second power supply; first and second switching devices, which are connected to the first current source and selectively supply current to one of the data bus pairs; third and fourth switching devices, which are connected to the second current source and selectively extract the current from another one of the data bus pairs; and a fifth switching device for interconnecting the data bus pairs together.

In one embodiment of the present invention, the changeable path selecting means further includes a controller for controlling the first through fifth switching devices. The controller is integrated together with the first through fifth switching devices on the same chip.

Another semiconductor integrated circuit according to the present invention is also connected to multiple data bus pairs, each of which is terminated with a resistor. The circuit includes means for selecting a changeable current path between first and second power supplies through the data bus pairs. The changeable path selecting means includes: a first current source, which is connected to the first power supply and supplies current to one of the data bus pairs; a second current source, which is connected to the second power supply and extracts the current from another one of the data bus pairs; and first, second, third and fourth switching devices connecting an associated pair of data lines between two adjacent ones of the data bus pairs.

In one embodiment of the present invention, the changeable path selecting means further includes a controller for controlling the first and second switching devices. The controller is integrated together with the first and second switching devices on the same chip.

In another embodiment of the present invention, the circuit further includes virtually enabling circuits associated with the respective data bus pairs. Each said virtually enabling circuit gets associated one of the data bus pairs virtually enabled just like the other data bus pairs even while no data is transmitted through the data bus pair.

According to the present invention, when data is transmitted through multiple data bus pairs that are driven with a supplied current as in IEEE 1394 high-speed data transmission, current that has been supplied to drive one of the data bus pairs is used to drive another. As a result, the data can be transmitted at high speeds with reduced current dissipation.

DESCRIPTION OF THE PREFERRED EMBODIMENTS

Hereinafter, preferred embodiments of the semiconductor integrated circuit system according to the present invention will be described with reference to the accompanying drawings.

Figure 1:
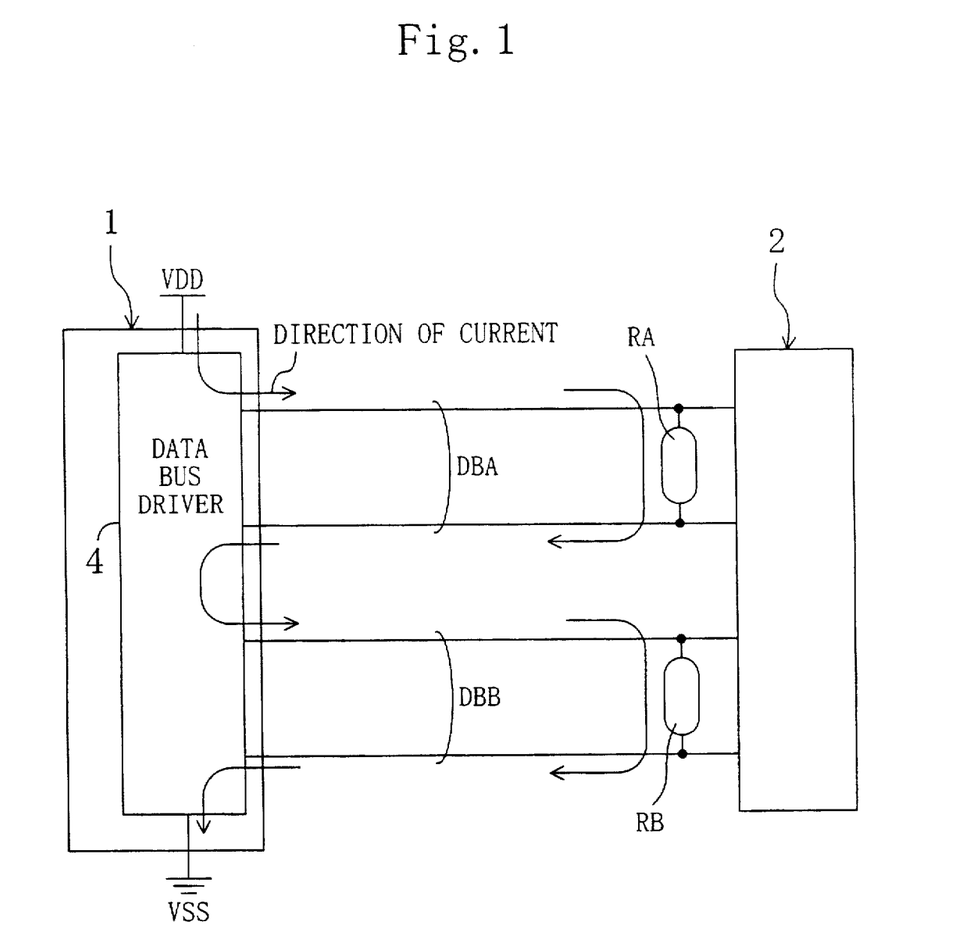
FIG. 1 illustrates an operational principle of a semiconductor integrated circuit system according to the present invention.

FIG. 1 illustrates an operational principle of the semiconductor integrated circuit system according to the present invention.

As shown in FIG. 1, two data bus pairs (or complementary data buses) DBA and DBB are provided between first and second chips 1 and 2, and are terminated with resistors RA and RB, respectively. The first chip 1 is provided with a data bus driver 4 for driving the data bus pairs DBA and DBB with a direct current supplied thereto. The data bus driver 4 is connected between power supply VDD and ground VSS. When these data bus pairs are driven with the current, respective voltages at the input end of the second chip 2 are determined based on the direct currents flowing through the terminal resistors RA and RB.

As described above, current is unnecessarily dissipated in the prior art system because the current always flows through all the data bus pairs. To avoid such a meaningless current dissipation by preventing the direct current from flowing through both of these data bus pairs DBA and DBB at the same time, the direct current that has flowed through one of the data bus pairs DBA is not drained to the ground as it is, but used for driving the other data bus pair DBB according to the present invention. Specifically, the driver 4 for the first chip 1 supplies current from the power supply VDD to the data bus pair DBA. One of the data lines included in the data bus pair DBA makes the current flow from the first to the second chip 1 to 2. The other data line feeds back the current, which has passed through the terminal resistor RA, from the second to the first chip 2 to 1. In the first chip 1, the driver 4 supplies the fed back current to one of the data lines included in the data bus pair DBB. In the same way, the driver 4 drains the current, which has been fed back through the other data line, to the ground VSS. As a result, the direct current flowing through these two data bus pairs DBA and DBB can be halved.

Figure 2:
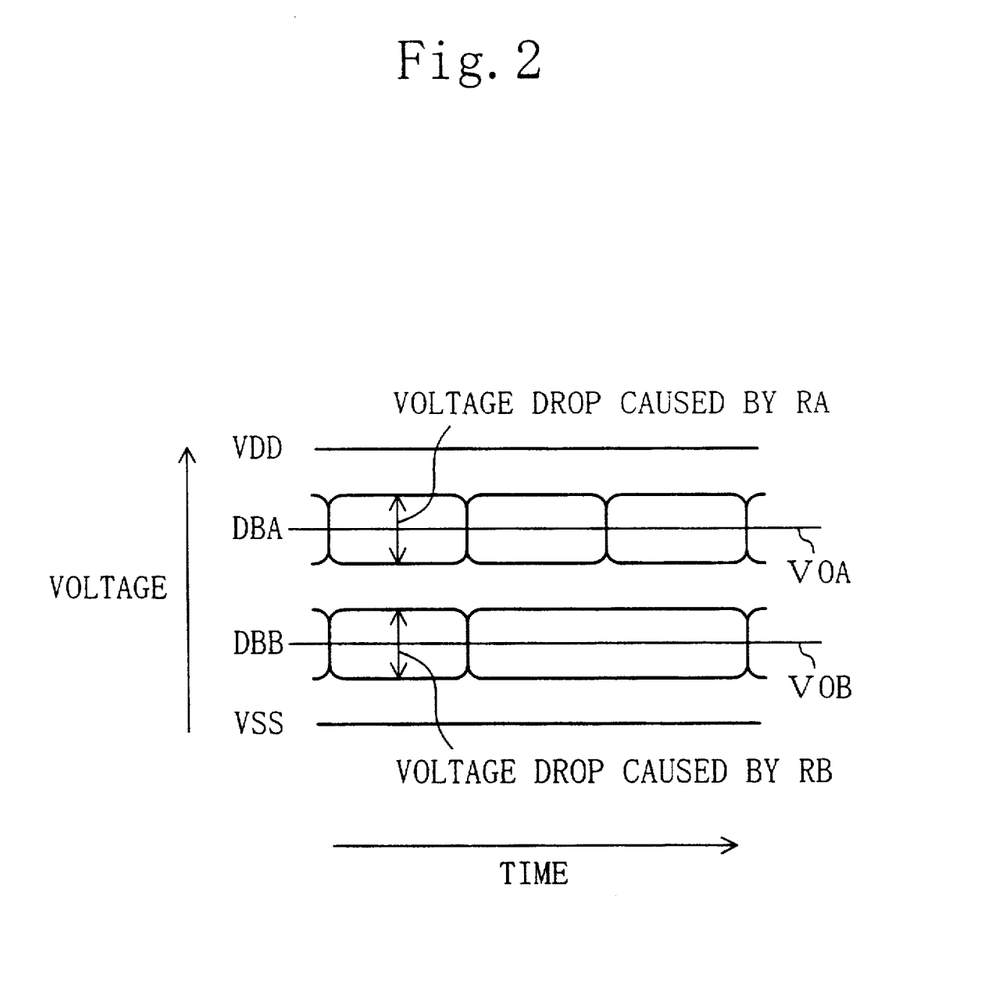
FIG. 2 is a schematic timing diagram illustrating the operation principle of the semiconductor integrated circuit system shown in FIG. 1.

FIG. 2 is a schematic timing diagram illustrating the operation principle of the semiconductor integrated circuit system shown in FIG. 1. As shown in FIG. 2, the two data bus pairs DBA and DBB are at mutually different potential levels due to the voltage drop caused at the terminal resistors RA and RB and at the driver 4.

In the illustrated embodiment, the current is supposed to flow along a single path through the two data bus pairs DBA and DBB. Alternatively, the principle of the present invention is also applicable to three or more data bus pairs so long as the voltage drop caused by the current flow is less than the supply voltage. In such a case, the direct current can be reduced to the inverse of the number of data bus pairs.

Figure 3:
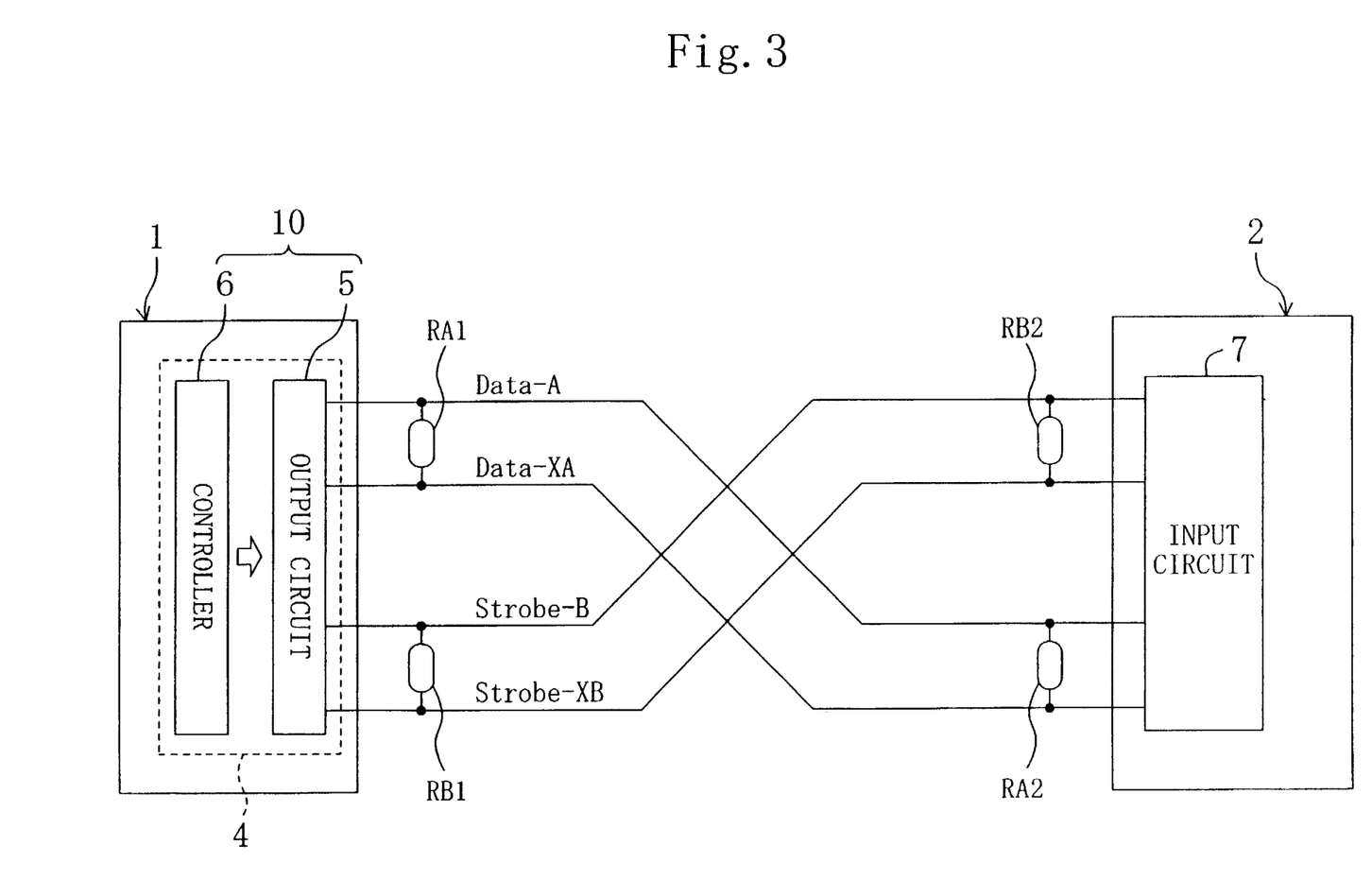
FIG. 3 illustrates an exemplary embodiment of a semiconductor integrated circuit system where the inventive concept is applied to the IEEE 1394 physical layer LSI.

FIG. 3 illustrates an exemplary embodiment of a semiconductor integrated circuit system where the inventive concept is applied to data transmission using an IEEE 1394 physical layer LSI.

As shown in FIG. 3, the data bus driver 4 in the first chip 1 includes an output circuit 5 and a controller 6, which together constitute changeable path selecting means 10. The first and second chips 1 and 2 are linked together via a pair of data lines Data-A and Data-XA and a pair of strobe lines Strobe-B and Strobe-XB. These data line and strobe line pairs are equivalent to the complementary data buses as defined in the appended claims. The output circuit 5 drives the data line pair Data-A and Data-XA and the strobe line pair Strobe-B and Strobe-XB with current supplied thereto according to the operation principle shown in FIG. 1. In the illustrated embodiment, the direct current is supplied from the power supply VDD (not shown in FIG. 5) through one data line Data-A and then fed back through the other data line Data-XA to the output circuit 5 by way of terminal resistors RA1 and RA2. In response, the output circuit 5 supplies the fed-back direct current to one strobe line Strobe-B. Then, the current is fed back again through the other strobe line Strobe-XB to the output circuit 5 by way of terminal resistors RB1 and RB2 and finally drained by the output circuit 5 to the ground VSS (not shown in FIG. 5, either).

The controller 6 controls the output circuit 5 to make the current flow from the power supply VDD to the ground VSS along a single path running through the data line pair Data-A and Data-XA, strobe line pair Strobe-B and Strobe-XB and terminal resistors RA1, RA2, RB1 and RB2. The single current path is changeable by the controller 6.

On the other hand, the second chip 2 is provided with an input circuit 7. The input circuit 7 operates responsive to respective potential differences between both terminals of the terminal resistor RA2 and between both terminals of the terminal resistor RB2. These potential differences are equal to each other, because the same direct current flows through both of these terminal resistors RA2 and RB2. However, the levels of these potentials are greatly different from each other due to the voltage drops. Accordingly, the potentials are supplied from the data line pair Data-A and Data-XA and the strobe line pair Strobe-B and Strobe-XB to the input circuit 7 at mutually different times. But the time lag does not cause a serious problem in the IEEE 1394 physical layer LSI, because such a time lag is characteristic of the DS-Link method in compliance with the IEEE 1394 standards. Specifically, according to the DS-Link method, if data that has been transmitted through the data line pair Data-A and Data-XA changes, then the data is latched on the edge at which the transition occurs. Alternatively, if the data does not change, then a strobe signal that has been transmitted through the strobe line pair Strobe-B and Strobe-XB changes instead and the data is latched on the edge at which the transition happens. That is to say, if the data changes, then the data is supposed to be latched exactly at the time the transition happens. However, if the data does not change but remains the same for several cycles, then the same data value can still be latched accurately even if the strobe signal has delayed for a certain period of time. Accordingly, such an IEEE 1394 physical layer LSI adopting the DS-Link method can have its current dissipation reduced effectively based on the principle of the present invention.

Figure 4:
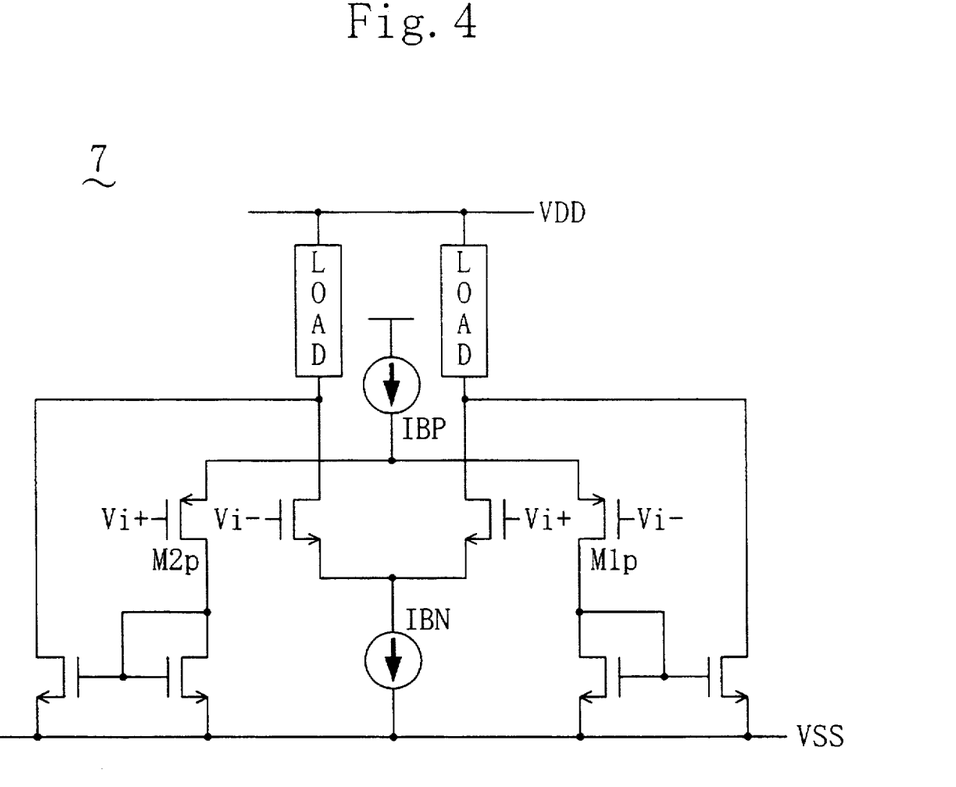
FIG. 4 is a circuit diagram illustrating a specific configuration for the input circuit included in the semiconductor integrated circuit system shown in FIG. 3.

The input circuit 7 for the second chip 2 may have an internal configuration such as that illustrated in FIG. 4. The input circuit shown in FIG. 4 is a wide-range rail-to-rail circuit covering the center potentials (common mode levels, see FIG. 2) VOA and VOB of the potential differences at the terminal resistors RA2 and RB2 for the data and strobe line pairs Data-A, Data-XA and Strobe-B, Strobe-XB. Thus, even if these common mode levels VOA and VOB are different from each other, the rail-to-rail circuit 7 can still latch the data on the data and strobe line pairs Data-A, Data-XA and Strobe-B, Strobe-XB at the same time.

It should be noted that the input circuit 7 does not have to be such a wide-range rail-to-rail circuit. Alternatively, a resistor may be disposed between the power supply VDD and ground VSS such that the common mode levels VOA and VOB of the data and strobe line pairs Data-A, Data-XA and Strobe-B, Strobe-XB can be biased toward the supply or ground voltage by changing the position of the resistor.

Figure 5:
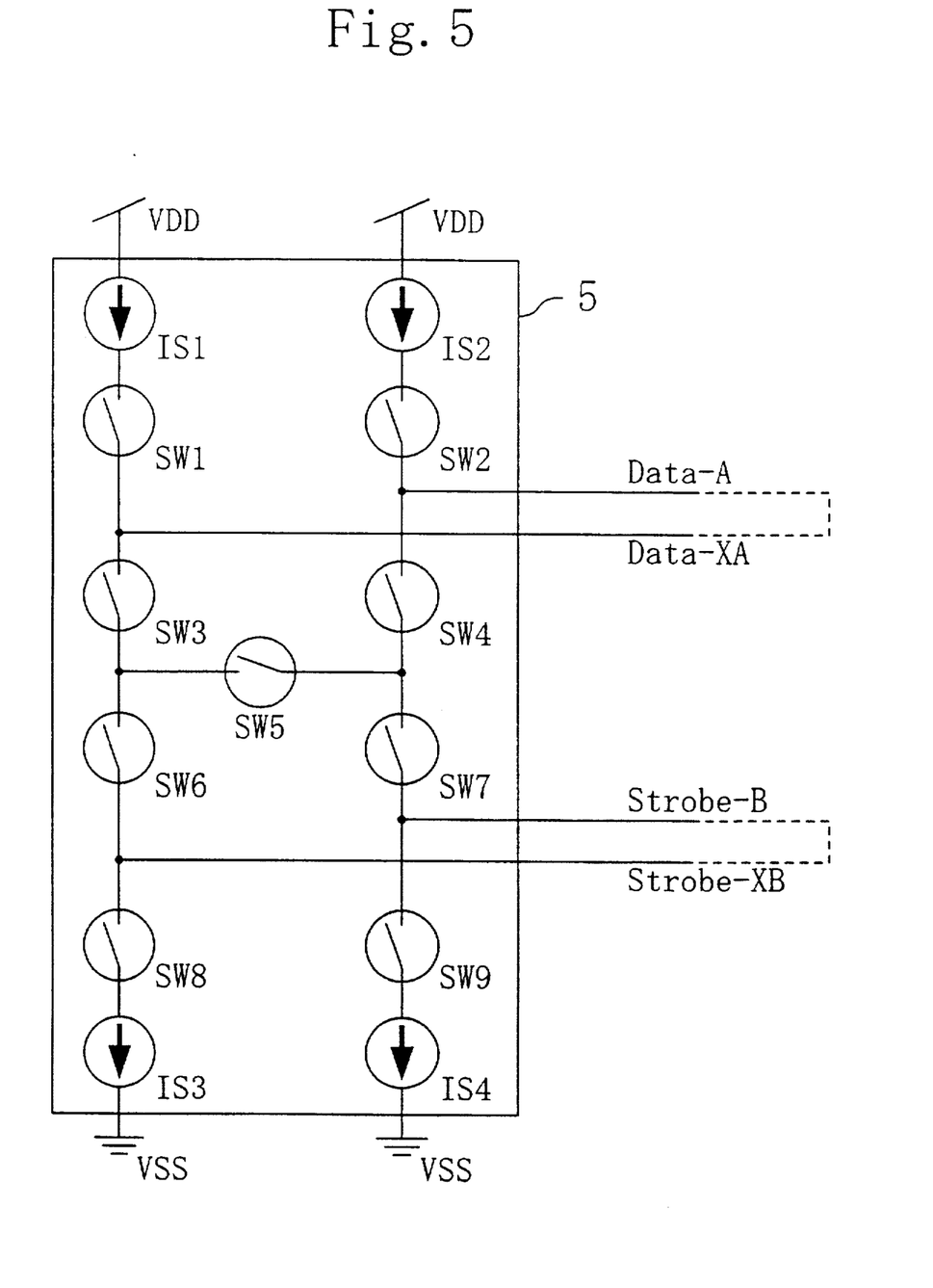
FIG. 5 is a circuit diagram illustrating a specific configuration for the output circuit included in the semiconductor integrated circuit system shown in FIG. 3.

FIG. 5 illustrates an internal configuration for the output circuit 5 shown in FIG. 3. The output circuit 5 is an embodiment of the semiconductor integrated circuit according to the present invention. As shown in FIG. 5, first current sources IS1 and IS2 are connected to the power supply VDD, while second current sources IS3 and IS4 are connected to the ground VSS. The power supply VDD and ground VSS are equivalent to the first and second power supplies as defined in the appended claims. First and second switching devices SW1 and SW2 are connected to the current sources IS1 and IS2, respectively, while third and fourth switching devices SW8 and SW9 are connected to the current sources IS3 and IS4, respectively. Five other switching devices SW3 through SW7 are provided as fifth switching devices between the first and second switching devices SW1, SW2 and the third and fourth switching devices SW8, SW9. One data line Data-A of the data line pair is connected between the switching devices SW2 and SW4, while the other data line Data-XA is connected between the switching devices SW1 and SW3. One strobe line Strobe-B of the strobe line pair is connected between the switching devices SW7 and SW9, while the other strobe line Strobe-XB is connected between the switching devices SW6 and SW8.

Each of the current sources IS1 through IS4 has an equal current drive capability, or can supply the same amount of current for driving purposes. One of the pair of current sources IS1 and IS2 supplies the current to the data line pair Data-A and Data-XA, while one of the pair of current sources IS3 and IS4 extracts the current from the strobe line pair Strobe-B and Strobe-XB. For example, if the current source IS1 supplies the current, then the other current source IS2 does not operate. And if the current source IS3 extracts the current, then the other current source IS4 does not operate. It should be noted that the pair of current sources IS1 and IS3 or IS3 and IS4 may be replaced with a single current source.

The ON/OFF states of the switching devices SW1 through SW9 are controlled by the controller 6 shown in FIG. 3 depending on respective levels (i.e., H and L levels) of the data transmitted through the data and strobe line pairs Data-A, Data-XA and Strobe-B, Strobe-XB as shown in the following Table 1:

TABLE 1

| Data-A | H | H | L | L |
|---|---|---|---|---|
| Data-XA | L | L | H | H |
| Strobe-B | H | L | H | L |
| Strobe-XB | L | H | L | H |
| SW1 | OFF | OFF | ON | ON |
| SW2 | ON | ON | OFF | OFF |
| SW3 | ON | ON | OFF | OFF |
| SW4 | OFF | OFF | ON | ON |
| SW5 | ON | OFF | OFF | ON |
| SW6 | OFF | ON | OFF | ON |
| SW7 | ON | OFF | ON | OFF |
| SW8 | ON | OFF | ON | OFF |
| SW9 | OFF | ON | OFF | ON |

The controller 6 controls the output circuit 5 such that current always flows from the power supply VDD to the ground VSS along a single path through the data and strobe line pairs Data-A, Data-XA and Strobe-B, Strobe-XB irrespective of the combination of ON/OFF states of the switching devices SW1 through SW9. That is to say, the direct current that has been supplied to drive the data line pair Data-A and Data-XA can be used to drive the strobe line pair Strobe-B and Strobe-XB.

MODIFIED EXAMPLE 1 OF OUTPUT CIRCUIT

Figure 6:
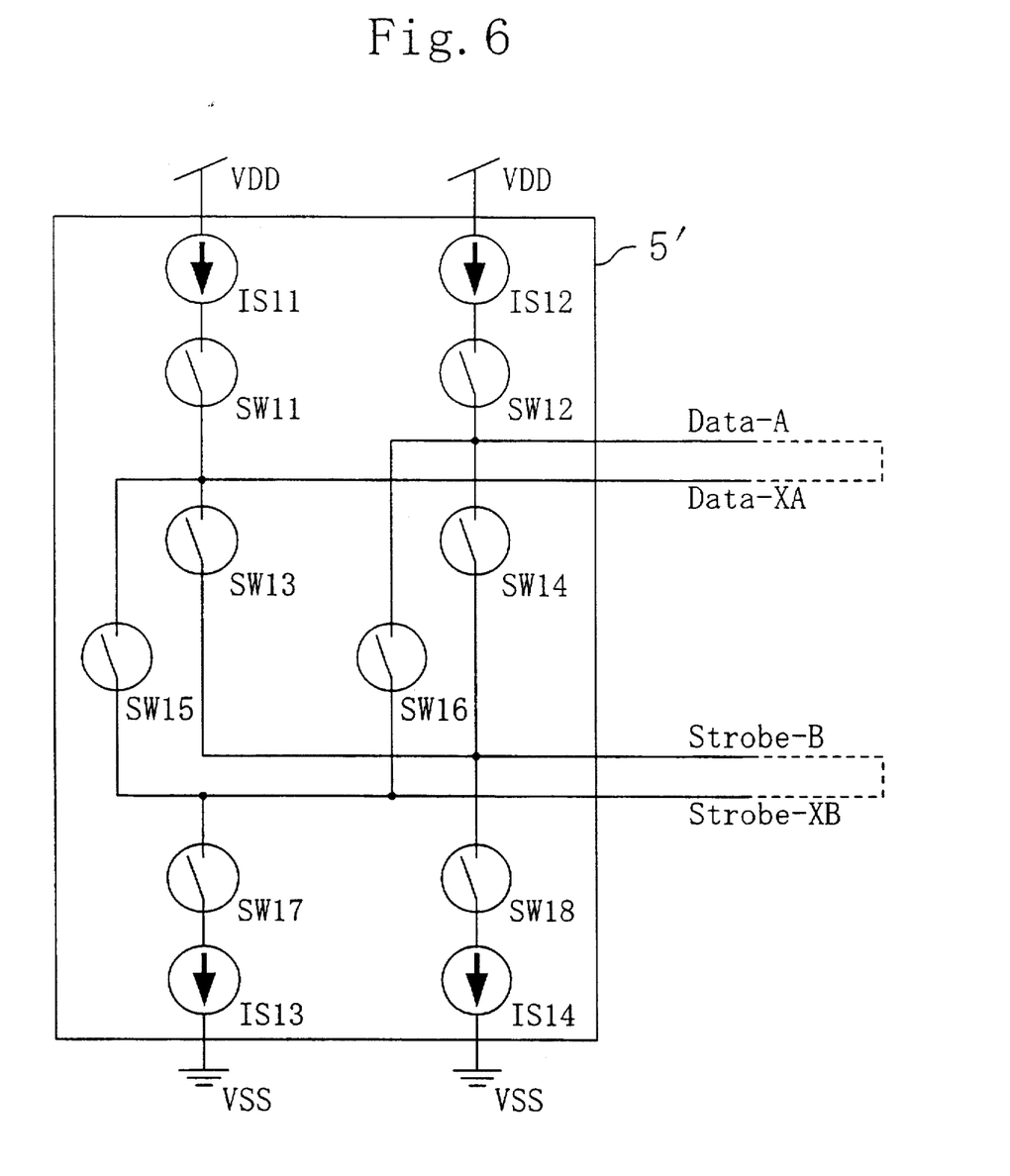
FIG. 6 is a circuit diagram illustrating a modified example of the output circuit included in the semiconductor integrated circuit system shown in FIG. 3.

FIG. 6 illustrates a modified example of the output circuit 5 included in the semiconductor integrated circuit system shown in FIG. 3.

As shown in FIG. 6, first current sources IS11 and IS12 are connected to the power supply VDD, while second current sources IS13 and IS14 are connected to the ground VSS. Switching devices SW11 and SW12 are connected to the current sources IS11 and IS12, respectively, while switching devices SW17 and SW18 are connected to the current sources IS13 and IS14, respectively. Four other switching devices SW13 through SW16 are provided as first through fourth switching devices between the data line pair Data-A, Data-XA and the strobe line pair Strobe-B, Strobe-XB.

The output circuit 5' shown in FIG. 6 operates in basically the same way as the output circuit 5 shown in FIG. 5. In the output circuit 5 of the type driving the loads with the direct current continuously supplied, the data transmission is affected by the voltage drops at the switching devices. Thus, it is also effective to reduce the number of switching devices on the current path. In the output circuit 5' according to this modified example, the first switching device SW13 connects the data line Data-XA to the strobe line Strobe-B. The second switching device SW14 connects the data line Data-A to the strobe line Strobe-B. The third switching device SW15 connects the data line Data-XA to the strobe line Strobe-XB. And the fourth switching device SW16 connects the data line Data-A to the strobe line Strobe-XB.

The output circuit 5 shown in FIG. 5 uses five switching devices at most to drive the two data bus pairs along a single current path. In contrast, according to this modified example, at most three switching devices are used at a time. Thus, the voltage drop caused in the output circuit 5' is smaller than that caused by the output circuit 5. As a result, it is possible for the output circuit 5' to drive a larger number of data bus pairs along a single current path compared to the output circuit 5 shown in FIG. 5.

In this modified example, the ON/OFF states of the switching devices SW11 through SW18 are also controlled by the controller 6 depending on respective levels of the data to be transmitted through the data bus pairs as represented in the following Table 2:

TABLE 2

| Data-A | H | H | L | L |
|---|---|---|---|---|
| Data-XA | L | L | H | H |
| Strobe-B | H | L | H | L |
| Strobe-XB | L | H | L | H |
| SW11 | OFF | OFF | ON | ON |
| SW12 | ON | ON | OFF | OFF |
| SW13 | ON | OFF | ON | OFF |
| SW14 | OFF | OFF | OFF | OFF |
| SW15 | OFF | OFF | OFF | OFF |
| SW16 | OFF | ON | OFF | ON |
| SW17 | ON | OFF | ON | OFF |
| SW18 | OFF | ON | OFF | ON |

If the output circuit 5 or 5' shown in FIG. 5 or 6 is built in the semiconductor integrated circuit, then the controller 6 for controlling the ON/OFF states as shown in Table 1 or 2 is provided on the same chip at a stage previous to the output circuit 5 or 5'.

MODIFIED EXAMPLE 2 OF OUTPUT CIRCUIT

Figure 7:
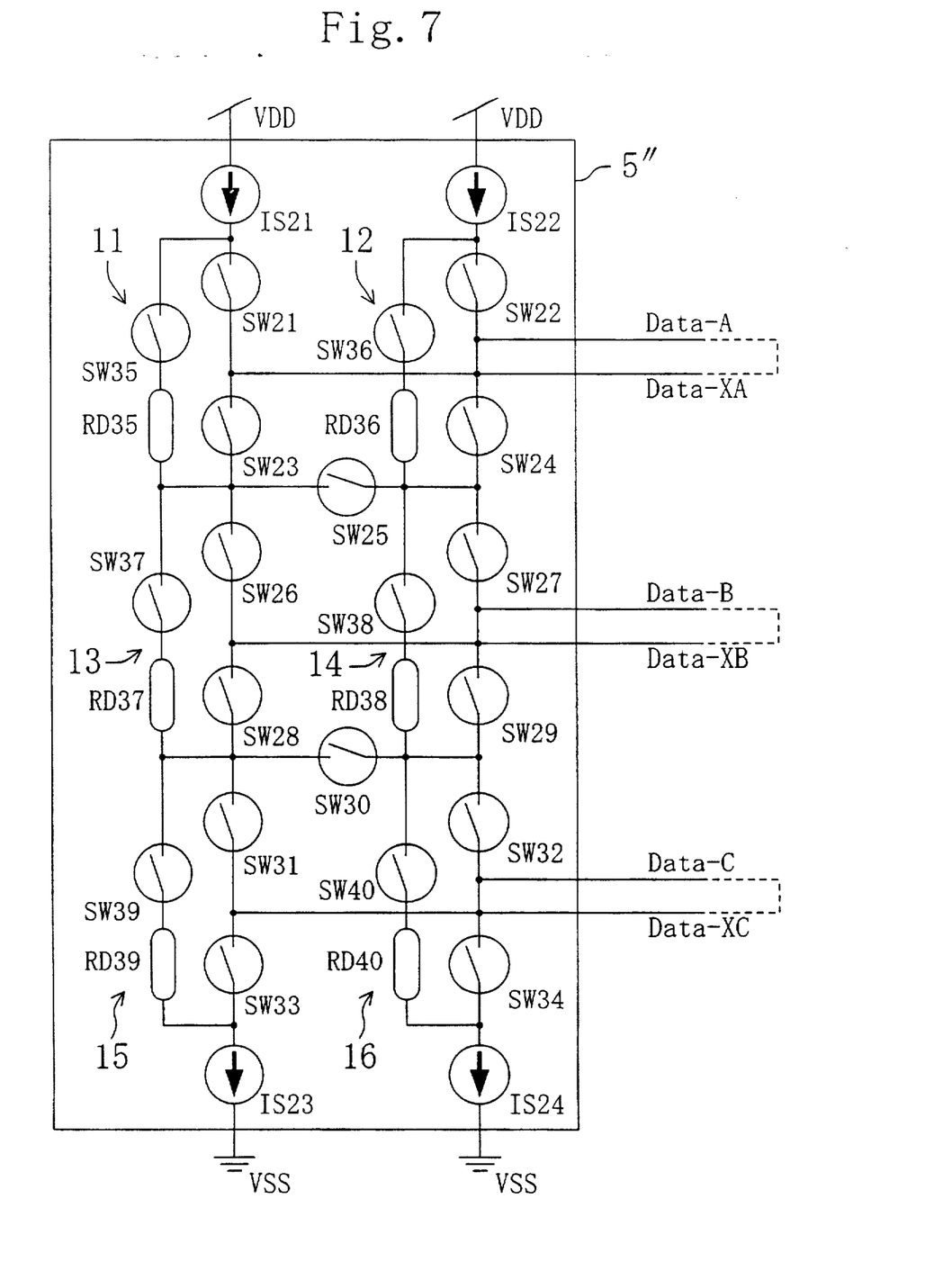
FIG. 7 is a circuit diagram illustrating another modified example of the output circuit included in the semiconductor integrated circuit system shown in FIG. 3.

FIG. 7 illustrates another modified example of the output circuit included in the semiconductor integrated circuit system shown in FIG. 3.

The output circuit 5" shown in FIG. 7 includes: current sources IS21 through IS24; switching devices SW21 through SW40; data bus pairs Data-A, Data-XA, Data-B, Data-XB and Data-C, Data-XC at respective ports; and pseudo-terminal resistors RD35 through RD40. The output circuit 5" shown in FIG. 7 is connected to the three data bus pairs, but operates in basically the same way as the output circuit 5 shown in FIG. 5.

According to this modified example, the output circuit 5" includes virtually enabling circuits for getting a disabled port virtually enabled. For example, suppose a port associated with the data bus pair Data-A and Data-XA has been disabled. If the output thereof is simply isolated, then the impedance at the other data bus pairs Data-B, Data-XB and Data-C, Data-XC, which are now being driven along a single current path, changes, thus also greatly changing the voltage level at these two ports. As a result, the capability of the receiver connected to these ports changes considerably, too, and operation timing cannot be adjusted appropriately anymore. To solve this problem, virtually enabling circuits, each including a resistor and a switching device, are provided for getting all the ports virtually enabled even if there is a disabled one.

Specifically, a virtually enabling circuit 11, which consists of the resistor RD35 and switching device SW35, and a virtually enabling circuit 12, which is made up of the resistor RD36 and switching device SW36, are provided for the data bus pair Data-A and Data-XA. A virtually enabling circuit 13, which consists of the resistor RD37 and switching device SW37, and a virtually enabling circuit 14, which is made up of the resistor RD38 and switching device SW38, are provided for the data bus pair Data-B and Data-XB. And a virtually enabling circuit 15, which consists of the resistor RD39 and switching device SW39, and a virtually enabling circuit 16, which is made up of the resistor RD40 and switching device SW40, are provided for the data bus pair Data-C and Data-XC.

For example, if the port associated with the data bus pair Data-A and Data-XA has been disabled, then the switching devices SW35 and SW36 are turned ON, thereby making the current flow through the pseudo-terminal resistors RD35 and RD36. In this manner, a voltage can be applied to the other two ports as if the current had flowed through the data bus pair Data-A and Data-XA. As a result, even if there is any disabled port, the receiver can operate under the same conditions as the situation where all the ports are enabled.

In this modified example, the ON/OFF states of the switching devices SW21 through SW40 are also controlled by the controller 6 depending on respective levels of the data to be transmitted through the data bus pairs as represented in the following Table 3:

TABLE 3

| Data-A | H | H | H | H | L | L | L | L | Z | — | — |
|---|---|---|---|---|---|---|---|---|---|---|---|
| Data-XA | L | L | L | L | H | H | H | H | Z | — | — |
| Data-B | H | H | L | L | H | H | L | L | — | Z | — |
| Data-XB | L | L | H | H | L | L | H | H | — | Z | — |
| Data-C | H | L | H | L | H | L | H | L | — | — | Z |
| Data-XC | L | H | L | H | L | H | L | H | — | — | Z |
| SW21 | OFF | OFF | OFF | OFF | ON | ON | ON | ON | OFF | — | — |
| SW22 | ON | ON | ON | ON | OFF | OFF | OFF | OFF | OFF | — | — |
| SW23 | ON | ON | ON | ON | OFF | OFF | OFF | OFF | OFF | — | — |
| SW24 | OFF | OFF | OFF | OFF | ON | ON | ON | ON | OFF | — | — |
| SW25 | ON | ON | OFF | OFF | ON | ON | OFF | OFF | OFF | OFF | — |
| SW26 | OFF | OFF | ON | ON | OFF | OFF | ON | ON | — | OFF | — |
| SW27 | ON | ON | OFF | OFF | ON | ON | OFF | OFF | — | OFF | — |
| SW28 | ON | ON | OFF | OFF | ON | ON | OFF | OFF | — | OFF | — |
| SW29 | OFF | OFF | ON | ON | OFF | OFF | ON | ON | — | OFF | — |
| SW30 | ON | OFF | OFF | ON | ON | OFF | OFF | ON | — | OFF | OFF |
| SW31 | OFF | ON | OFF | ON | OFF | ON | OFF | ON | — | — | OFF |
| SW32 | ON | OFF | ON | OFF | ON | OFF | ON | OFF | — | — | OFF |
| SW33 | ON | OFF | ON | OFF | ON | OFF | ON | OFF | — | — | OFF |
| SW34 | OFF | ON | OFF | ON | OFF | ON | OFF | ON | — | — | OFF |
| SW35 | OFF | OFF | OFF | OFF | OFF | OFF | OFF | OFF | ON | — | — |
| SW36 | OFF | OFF | OFF | OFF | OFF | OFF | OFF | OFF | ON | — | — |
| SW37 | OFF | OFF | OFF | OFF | OFF | OFF | OFF | OFF | — | ON | — |

TABLE 3-continued

| | | | | | | | | | | | |
|---|---|---|---|---|---|---|---|---|---|---|---|
| SW38 | OFF | OFF | OFF | OFF | OFF | OFF | OFF | OFF | — | ON | — |
| SW39 | OFF | OFF | OFF | OFF | OFF | OFF | OFF | OFF | — | — | ON |
| SW40 | OFF | OFF | OFF | OFF | OFF | OFF | OFF | OFF | — | — | ON |

If the output circuit 5" shown in FIG. 7 is built in the semiconductor integrated circuit, then the controller 6 for controlling the ON/OFF states as shown in Table 3 should be provided on the same chip at a stage previous to the output circuit 5".

We confirmed based on the results of simulations that an amplitude of 200 mV can be obtained at each of the three data bus pairs Data-A, Data-XA, Data-B, Data-XB and Data-C, Data-XC when the supply voltage VDD is set at 3 V.

As is apparent from the foregoing description, when data is transmitted through multiple data bus pairs that are driven with a current supplied as in IEEE 1394 high-speed data transmission, current that has been supplied to drive one of the data bus pairs is used to drive another. As a result, the data can be transmitted at high speeds with reduced current dissipation.

What is claimed is:

1. A semiconductor integrated circuit system comprising first and second chips and
   a plurality of complementary data buses, each said bus being terminated with a resistor,
   the system exchanging data between the first and second chips through the complementary data buses,
   wherein the improvement comprises:
      a driver with a current drive capability, the driver driving the complementary data buses with a current supplied thereto; and
      means for selecting a changeable current path between power supply and ground through the complementary data buses.

2. The system of claim 1, wherein each said complementary data bus comprises a pair of data lines, one of the data lines making the current flow from the first to the second chip, while the other data line making the current flow from the second to the first chip.

3. The system of claim 1, further comprising an input circuit for receiving potential differences at the respective terminal resistors of the complementary data buses,
   wherein the input circuit covers a wide range including all center potentials of the potential differences at the respective terminal resistors of the complementary data buses.

4. The system of claim 1, wherein center potentials of potential differences at the respective terminal resistors of the complementary data buses are biased toward a supply or ground potential as a whole.

5. A semiconductor integrated circuit connected to multiple data bus pairs, each said data bus pair being terminated with a resistor,
   wherein the circuit comprises means for selecting a changeable current path between first and second power supplies through the data bus pairs, and
   wherein the changeable path selecting means includes:
      a first current source connected to the first power supply;
      a second current source connected to the second power supply;
      first and second switching devices, which are connected to the first current source and selectively supply current to one of the data bus pairs;
      third and fourth switching devices, which are connected to the second current source and selectively extract the current from another one of the data bus pairs; and
      a fifth switching device for interconnecting the data bus pairs together.

6. The circuit of claim 5, wherein the changeable path selecting means further comprises a controller for controlling the first through fifth switching devices, the controller being integrated together with the first through fifth switching devices on the same chip.

7. The circuit of claim 5 or 6, further comprising virtually enabling circuits associated with the respective data bus pairs, each said virtually enabling circuit getting associated one of the data bus pairs virtually enabled just like the other data bus pairs even while no data is transmitted through the data bus pair.

8. A semiconductor integrated circuit connected to multiple data bus pairs, each said data bus pair being terminated with a resistor, each said data bus pair having a first data line and a second data line;
   wherein the circuit comprises means for selecting a changeable current path between first and second power supplies through the data bus pairs, and
   wherein the changeable path selecting means includes:
      a first current source, which is connected to the first power supply and supplies current to a first data bus pair of the data bus pairs;
      a second current source, which is connected to the second power supply and extracts the current from a second data bus pair of the data bus pairs; and
      first, second, third and fourth switching devices,
         the first switching device being connected to the second data line of the first data bus pair and to the first data line of the second data bus pair;
         the second switching device being connected to the first data line of the first data bus pair and to the first data line of the second data bus pair;
         the third switching device being connected to the second data line of the first data bus pair and to the second data line of the second data bus pair; and
         the fourth switching device being connected to the first data line of the first data bus pair and to the second data line of the second data bus pair.

9. The circuit of claim 8, wherein the changeable path selecting means further comprises a controller for controlling the first and second switching devices, the controller being integrated together with the first and second switching devices on the same chip.

10. The circuit of claim 8 or 9, further comprising virtually enabling circuits associated with the respective data bus pairs, each said virtually enabling circuit getting associated one of the data bus pairs virtually enabled just like the other data bus pairs even while no data is transmitted through the data bus pair.

11. A semiconductor integrated circuit system comprising:
   first and second integrated circuit chips,
   a plurality of complementary data buses, each said bus being terminated with a resistor, said system exchanging data between the first integrated circuit chip and the second integrated circuit chip through the complementary data buses, and a driver with a current drive capability for driving the complementary data buses,
wherein a current being utilized to drive a first complementary data bus of said plurality of complementary data buses is also utilized to drive a second complementary data bus of said plurality of complementary data buses.

12. The semiconductor integrated circuit system of claim 11, wherein each of said plurality of complementary data buses comprises two data lines, a first data line of a given complementary data bus being utilized to feed current from said first integrated circuit chip to said second integrated circuit chip, and a second data line of said given complementary data bus being utilized to feed current from said second integrated circuit chip to said first integrated circuit chip.

13. The semiconductor integrated circuit system of claim 12, wherein said first data line and said second data line are coupled in series such that the same current fed by said first integrated circuit chip to the second integrated circuit chip via said first data line is returned to the first integrated circuit chip via the second data line.

14. The semiconductor integrated circuit system of claim 13, wherein said current returned to the first integrated circuit chip via the second data line of said given complementary data bus is utilized to drive a first data line of another complementary data bus.

15. The semiconductor integrated circuit system of claim 1, wherein said means for selecting a changeable current path provides for a current being utilized to drive a first complementary data bus of said plurality of complementary data buses to also be utilized to drive a second complementary data bus of said plurality of complementary data buses.

16. The semiconductor integrated circuit system of claim 1, wherein each of said plurality of complementary data buses comprises two data lines, a first data line of a given complementary data bus being utilized to feed current from said first chip to said second integrated circuit chip, and a second data line of said given complementary data bus being utilized to feed the same current from said second chip to said first chip.

17. The semiconductor integrated circuit system of claim 16, wherein said first data line and said second data line are coupled in series.

18. The semiconductor integrated circuit system of claim 16, wherein said current returned to the first integrated circuit chip via the second data line of said given complementary data bus is utilized to drive a first data line of another complementary data bus.

19. The semiconductor integrated circuit system of claim 8, wherein said means for selecting a changeable current path provides for a current being utilized to drive a first data bus pair of said plurality of data bus pairs to also be utilized to drive a second data bus pair of said plurality of data bus pairs.

* * * * *